(12) United States Patent
Korger et al.

(10) Patent No.: US 6,600,681 B1
(45) Date of Patent: Jul. 29, 2003

(54) METHOD AND APPARATUS FOR CALIBRATING DQS QUALIFICATION IN A MEMORY CONTROLLER

(75) Inventors: Peter Korger, Frederick, CO (US); Robert W. Moss, Longmont, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/165,920

(22) Filed: Jun. 10, 2002

(51) Int. Cl.$^7$ .................................................. G11C 7/00
(52) U.S. Cl. ........................ 365/193; 365/194; 365/233
(58) Field of Search .................................. 365/193, 194, 365/233

(56) References Cited

U.S. PATENT DOCUMENTS 6,477,110 B2 * 11/2002 Yoo et al. ................... 365/193
6,493,285 B1 * 12/2002 Wolford ...................... 365/194

* cited by examiner

*Primary Examiner*—Huan Hoang
(74) *Attorney, Agent, or Firm*—Westman, Champlin & Kelly

(57) ABSTRACT

A method an apparatus are provided for calibrating a mask signal which is used for masking a data strobe signal that is received from a memory device with read data. According to the method, one or more read operations are performed with the memory device, and the data strobe signal is sampled at a plurality of different time delays relative to a local clock signal to produce a plurality of data strobe sample values. The plurality of data strobe sample values are searched to identify a temporal location within a preamble phase of the data strobe sample values and one of the time delays that corresponds to the temporal location. A delay at which the mask signal is disabled in response to a read operation is then set relative to the local clock signal based on the time delay corresponding to the temporal location.

16 Claims, 4 Drawing Sheets

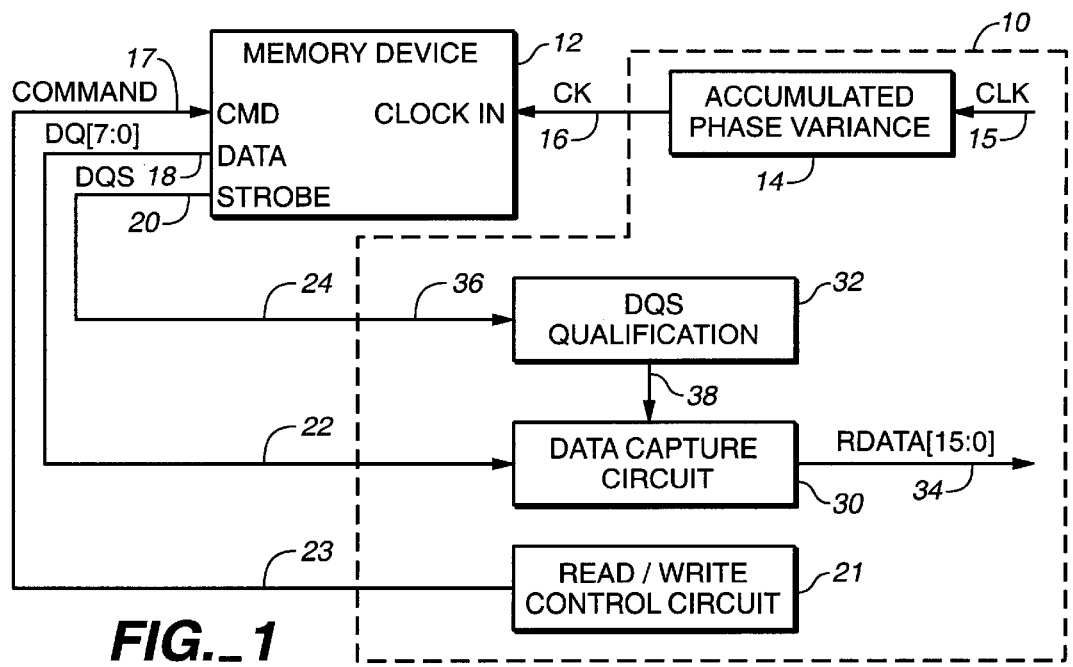
FIG._1
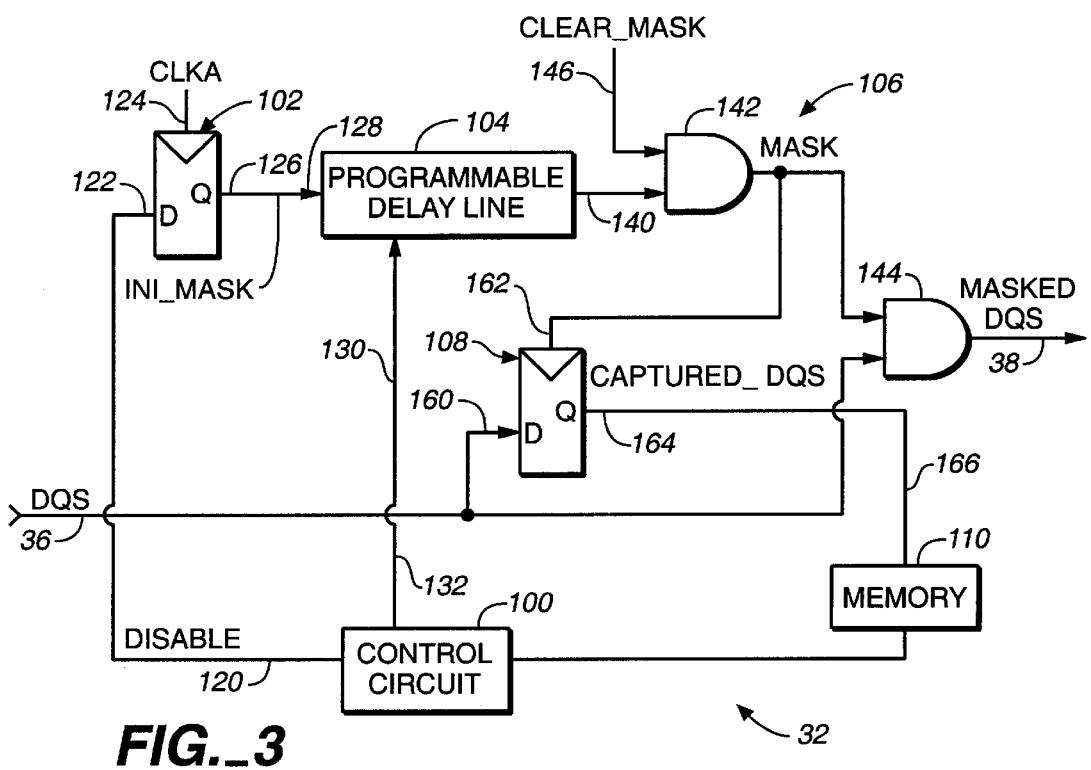
FIG._3

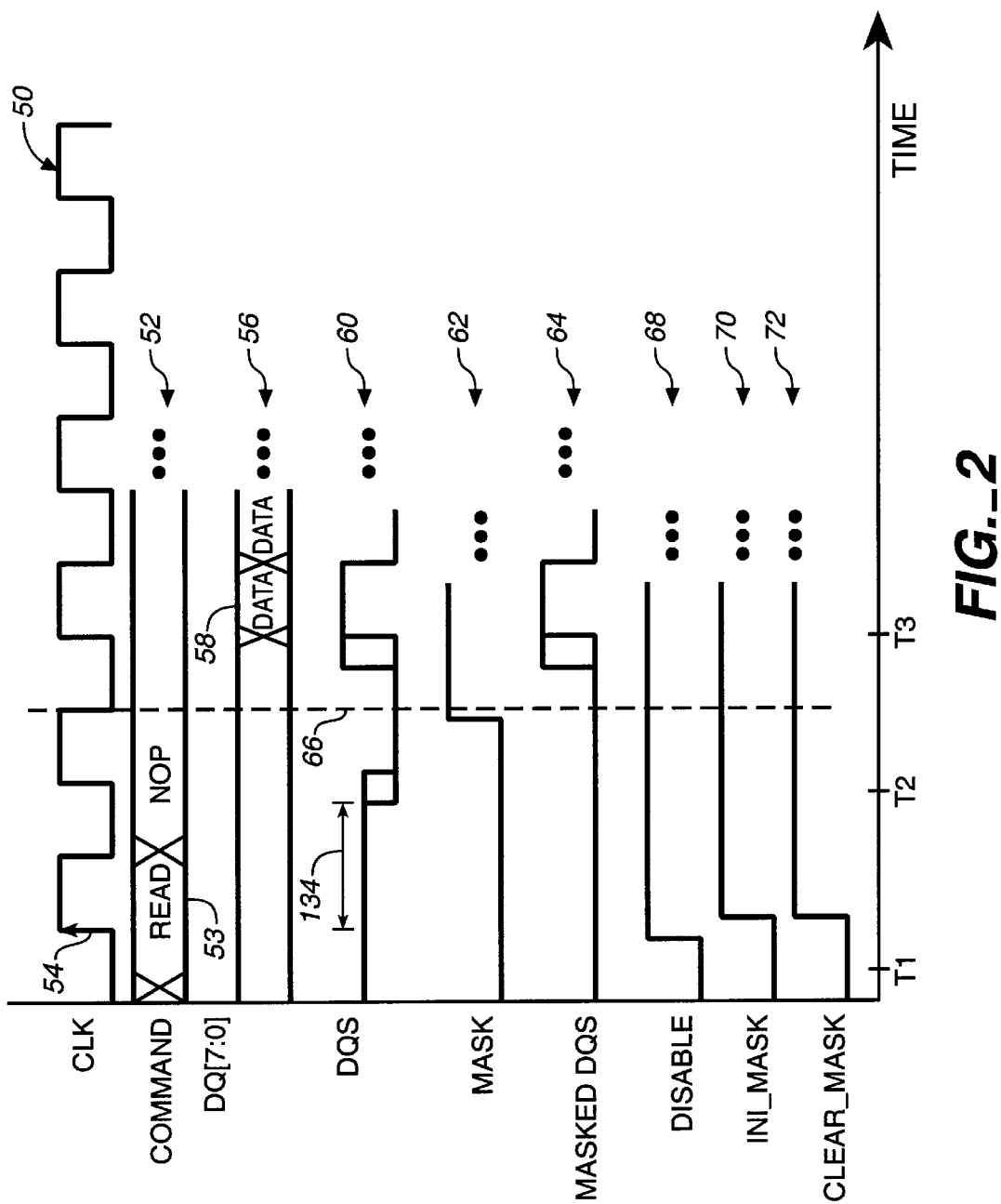
FIG._2

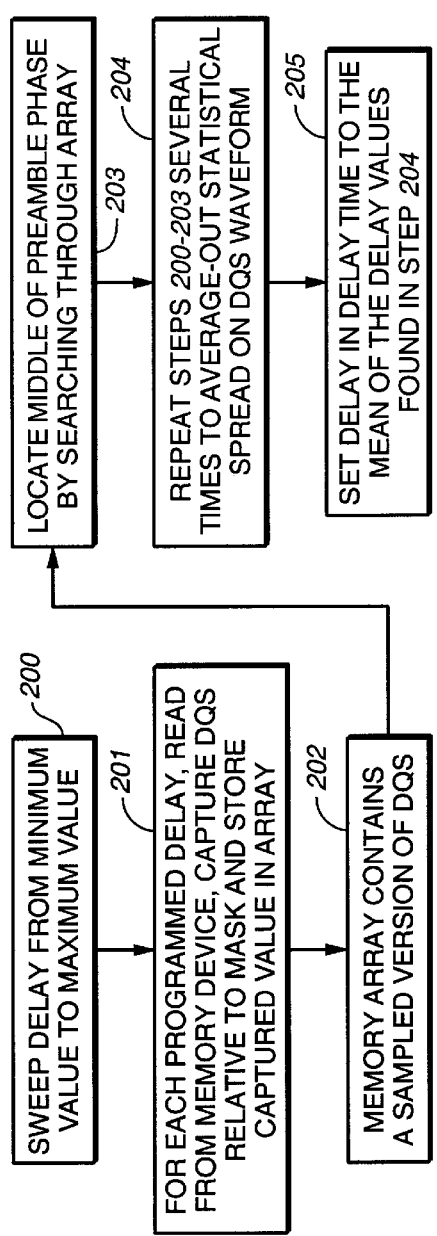
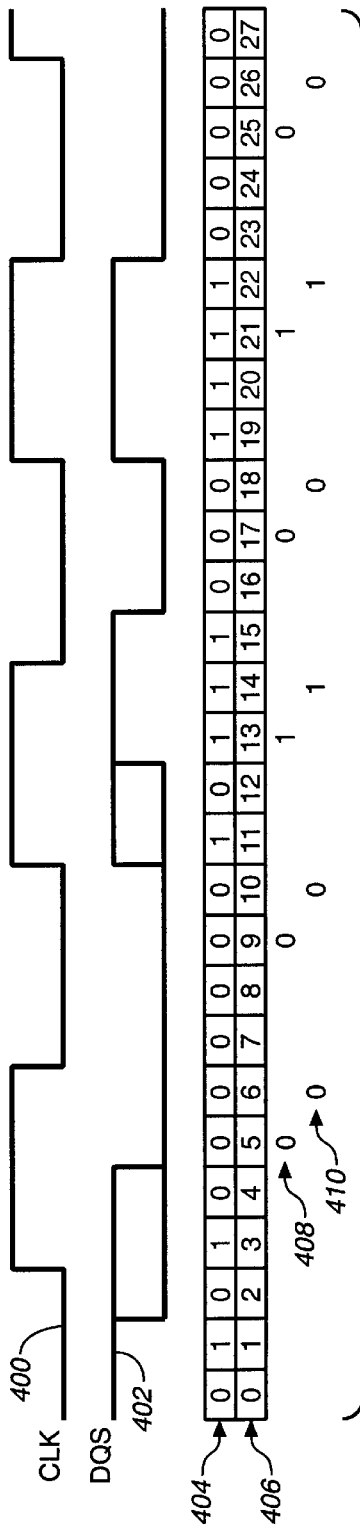
FIG._4
FIG._6

```
301 ─── previous_match = FALSE;
302 ─── step = 4;              // 4 steps in the delay line corresponds to a half a
                               // CLK period
303 ─── low_index = -1;
304 ─── high_index = -1;                                    ┌─ 320
305 ─── for index from 0 to MAX_ARRAY_VALUE do
        begin
          ┌ if [(array[index] = = expected_dqs[0]) AND
          │    (array[index+1*step] = = expected_dqs[1]) AND
          │    (array[index+2*step] = = expected_dqs[2]) AND
306 ─────┤    (array[index+3*step] = = expected_dqs[3]) AND
          │    (array[index+4*step] = = expected_dqs[4]) AND
          └    (array[index+5*step] = = expected_dqs[5])]
          then
            begin
307 ───────── if (low_index < 0)        // only test when low_index has not been found
              begin
308 ─────────── if (previous_match = T)  // want the same match twice
                begin
309 ─────────────── low_index = index-1   // index equals value of previous index
                                          // value which also was a match
                end
                else
                begin
310 ─────────────── previous_match = T
                end
              end
              else
              begin
311 ─────────── if (low_index > = 0)     // only test when low_index has been found
                begin
312 ─────────────── high_index = index   // last value where the pattern matched
                end
              end
            end
            else
            begin
313 ───────── previous_match = F
              end
        end
```

FIG._5

METHOD AND APPARATUS FOR CALIBRATING DQS QUALIFICATION IN A MEMORY CONTROLLER

FIELD OF THE INVENTION

The present invention relates to semiconductor integrated circuits and more particularly to calibration of a mask signal used to qualify a DQS strobe signal received by a memory controller from a memory device.

BACKGROUND OF THE INVENTION

Certain types of memory devices utilize a bi-directional data strobe signal (DQS) having edges that are aligned relative to changes in read or write data. A double data rate (DDR) dynamic random access memory (DRAM) transfers data on each rising and falling edge of the DQS signal. A DDR DRAM therefore transfers two data words per clock cycle.

A memory controller is often used to coordinate the transfer of data to and from a memory device, such as a DDR DRAM. The memory controller provides a local clock signal to the memory device for synchronizing read and write operations. During write operations, the memory controller transmits the DQS signal with the write data to the memory device. During read operations, the memory device transmits the DQS signal with the read data to the memory controller. When the memory bus is idle neither the memory controller nor the memory device drives the DQS signal line, and the DQS signal has an invalid, tri-state logic level. When driven, the DQS signal has predefined phase constraints with respect to the local clock signal provided by the memory controller.

During read operations, the memory controller uses the DQS signal for determining when the read data is valid and can therefore be latched. However, the memory controller can look at the DQS signal only when the DQS signal is valid (i.e., not tri-stated). When the DQS signal is tri-stated, a typical memory controller will mask the DQS signal with a mask signal in order to prevent an unknown state from being detected. When the DQS signal becomes valid, the mask signal is disabled and the next transition in the unmasked DQS signal indicates read data is available. The process of masking the DQS signal is sometimes referred to as "DQS qualification". In order to maximize the size of the read data capture window, it is preferable to disable the masking of the DQS signal in the middle of the preamble phase of the DQS signal waveform. The preamble phase begins when the DQS signal becomes valid and ends with the next transition in the DQS signal.

One method of controlling disablement of the DQS mask after issuing a read command is to disable the mask at a predetermined time delay relative to the memory controller's local clock signal, which has a predetermined phase relationship with the DQS signal. This time delay is determined based on signal delays and operating conditions that are estimated during the design process. However, this predetermined masking delay requires a large timing margin due to differences between the estimated signal delays and actual signal delays in a particular device. These differences can be caused by input/output (I/O) pad delay variations, power supply fluctuations, process variations, temperature variations and variations in the clock input-to-DQS signal output characteristics of the memory device, for example. As a result, the phase relationship between the memory controller's local clock signal and the DQS signal can vary from one device to the next and can change over time. The added timing margin within the predetermined, fixed masking delay sets an unnecessary limit on the operating speed of the memory controller.

Improved memory controller circuits are therefore desired that are capable of calibrating the masking delay for the particular integrated circuit or printed circuit board (PCB) in which the controller is used.

SUMMARY OF THE INVENTION

One embodiment of the present invention is directed to a method of calibrating a mask signal which is used for masking a data strobe signal that is received from a memory device with read data. According to the method, one or more read operations are performed with the memory device, and the data strobe signal is sampled at a plurality of different time delays relative to a local clock signal to produce a plurality of data strobe sample values. The plurality of data strobe sample values are searched to identify a temporal location within a preamble phase of the data strobe sample values and one of the time delays that corresponds to the temporal location. A delay at which the mask signal is disabled in response to a read operation is then set relative to the local clock signal based on the time delay corresponding to the temporal location.

Another embodiment of the present invention is directed to a read data strobe qualification circuit, which includes a data strobe input, a mask disable control input, a programmable delay line, a data strobe mask circuit, a data strobe capture circuit, a memory device and a control circuit. The programmable delay line is coupled to the mask disable control input and has a delayed mask control output. The data strobe mask circuit has a first input coupled to the data strobe input, a second input coupled to the delayed mask control output and a masked data strobe output. The data strobe capture circuit has a data input coupled to the data strobe input, a capture control input coupled to the delayed mask control output, and a captured data strobe output. The memory device is coupled to the captured data strobe output, and the control circuit is coupled in a feedback loop from the memory device to a delay control input of the programmable delay line.

BRIEF DESCRIPTION OF THE DRAWINGS

FIG. 1 is a schematic diagram of a memory controller coupled to a memory device according to one embodiment of the present invention.

FIG. 2 is a waveform diagram illustrating various waveforms produced by the circuit shown in FIG. 1 during a read operation.

FIG. 3 is a schematic diagram illustrating a DQS qualification circuit within the memory controller shown in FIG. 1, according to one embodiment of the present invention.

FIG. 4 is a flow chart illustrating method for calibrating a programmable delay line within the DQS qualification circuit shown in FIG. 3, according to one embodiment of the present invention.

FIG. 5 is a diagram illustrating an algorithm for locating the middle of a DQS waveform within the method shown in FIG. 4, according to one embodiment of the present invention.

FIG. 6 is a diagram illustrating CLK and DQS waveforms superimposed onto an example of an array of sampled DQS values obtained in the method shown in FIG. 4.

DETAILED DESCRIPTION OF ILLUSTRATIVE EMBODIMENTS

FIG. 1 is a schematic diagram of a memory controller 10 coupled to a memory device 12 according to one embodiment of the present invention. For simplicity, only a portion of memory controller 10 is shown in FIG. 1. Memory controller 10 has an internal local clock signal CLK, which is used for synchronizing various functions within the memory controller including the capture of data received from memory device 12 and for synchronizing read and write operations within memory device 12 through clock output 15.

In the example shown in FIG. 1, memory device 12 is a double data rate (DDR) dynamic random access memory (DRAM) having a clock input 16 labeled "CK", a command input 17 labeled "COMMAND", an 8-bit data port 18 labeled "DQ[7:0]", and a data strobe pin 20 labeled "DQS". An 8-bit data port is shown as an example only, and any size data port could be used in alternative embodiments. Clock input 16 is coupled to clock output 15 of memory controller 15 for receiving the memory controller's local clock signal CLK. The clock signal "CK" received at clock input 16 is related to memory controller clock CLK but has an accumulated phase variance 14 based on initial conditions such as process variations, PC board characteristics, etc. This phase variance can also vary over time due to power supply fluctuations, variations in temperature, PLL jitter and DLL quantization.

When performing a read operation, read/write control circuit 21 generates a read command on command output 23, which is coupled to command input 17, and provides the corresponding address (not shown) from which the data is to be read. Memory device 12 responsively provides an 8-bit data word DQ[7:0] on data port 18 and generates a DQS signal on pin 20, which is aligned with the data and has a specified phase relationship to the input clock signal CK. In the case of a DDR memory device, the data on data port 18 changes on both the rising and falling edges of DQS.

Although not shown in FIG. 1, when memory controller 10 performs a write operation, memory controller 10 generates a write command on command output 23, provides the write data to data port 18 and drives the DQS signal such that its edges align with changes in the write data. Memory controller 10 also provides the write address to memory device 12. When the memory bus is idle neither memory controller 10 nor memory device 12 drives the DQS signal line, and the DQS signal has an invalid, tri-state logic level.

Data port 18 and DQS pin 20 are coupled to data input 22 and DQS input 24, respectively, of memory controller 10. Input 22 is coupled to a data capture circuit 30 within memory controller 10 for capturing the successive data words DQ[7:0] provided by memory device 12. Data capture circuit 30 latches data at approximately the center of the windows during which the data words are valid. For example in one embodiment, data capture circuit 30 captures data at approximately ¼ clock period from the rising and falling edges of DQS. With this configuration, two 8-bit data words are captured during each cycle of DQS, which are provided as a combined read data output RDATA[15:0] on data output 34 for each clock cycle.

In order to ensure that data capture circuit 30 captures valid data, data capture circuit 30 looks at the DQS signal only when it has a valid logic state. DQS qualification circuit 32 masks the DQS signal when neither memory controller 10 nor memory device 12 is driving the DQS signal line. DQS qualification circuit 32 has a DQS input 36 coupled to DQS input 24 of memory controller 10 and a masked DQS output 38 coupled to data capture circuit 30.

DQS qualification circuit 32 masks the received DQS signal with an internal mask signal, which has an enabled state and a disabled state. When enabled, the mask signal holds output 38 in a known, stable state such as a logic low level or a logic high level. When the DQS signal becomes valid, the mask signal is disabled allowing the DQS signal to pass through to data capture circuit 30. The next transition in DQS indicates that read data is available for capture on data input 22.

In order to maximize the size of the read data capture window, particularly when data is read on both edges of the clock, it is preferable to disable the masking of the DQS signal in the middle of a preamble phase of the DQS signal waveform. The preamble phase begins when the DQS signal becomes valid and ends with the next transition in the DQS signal. The middle of the preamble phase has a predetermined phase relationship to the local clock signal CLK. Once a read command has been issued, DQS qualification circuit 32 can use this phase relationship to determine when to disable the mask signal relative to the local clock signal CLK.

However the actual time delay from a corresponding edge of the local clock signal CLK to the middle of the preamble phase of DQS can vary from one device to the next and can vary over time. These variances can be caused by input/output (I/O) pad delay variations, power supply fluctuations, process variations, temperature variations, variations in the clock input-to-DQS signal output characteristics of memory device 12, and variations in propagation delays on printed circuit boards (PCBs), for example. In order to account for these variances, DQS qualification circuit 32 has the ability to measure the actual delay needed to disable the mask signal at a selected temporal location within the preamble phase of the DQS signal waveform and to set the time delay to the measured value.

FIG. 2 is a waveform diagram illustrating various waveforms produced by memory controller 10 and memory device 12 during the DQS qualification process. Waveform 50 represents the local clock signal CLK provided to memory device 12 by memory controller 10. Waveform 52 represents the command signal sent to memory device 12 by memory controller 10. At time T1, memory controller 10 issues a read command 53 signaling a four word burst read from memory device 12. Waveform 56 represents the read data DQ[7:0] provided by memory device 12 in response to read command 53. In this example, memory device 12 has a column address select (CAS) latency of two clock cycles. Therefore, the first word 58 of the read data becomes available two clock cycles after rising edge 54 of CLK.

Waveform 60 represents the beginning of the DQS signal produced by memory device 12 in response to read command 53. Prior to time T2, the memory device 12 is idle and DQS has an invalid, tri-state logic level. At time T2, in response to read command 53, memory device 12 drives DQS low after a brief uncertainty period and holds DQS low until time T3 at which data word 58 is available. DQS then transitions high. The period during which DQS is held low from time T2 to time T3 is known as the preamble phase of the DQS signal. The preamble phase immediately precedes the first low-to-high transition in the DQS signal. Following the preamble phase, DQS changes state once for each data word being read from memory device 12.

Waveform 62 represents the mask signal generated within DQS qualification circuit 32 (shown in FIG. 1). The MASK signal is logically ANDed with the DQS signal to produce the masked DQS signal 38, which is represented by waveform 64. The MASK signal is held low (i.e., enabled) when DQS is in the invalid, tri-state mode and then disabled to the logic high state during the preamble phase of DQS. The MASK signal is then held high for the remainder of the burst length. The MASK signal blocks any unknown logic states in the DQS signal waveform 60 from being passed to the masked DQS signal waveform 64.

In one embodiment, the mask signal is preferably disabled at the middle of the preamble phase of the DQS signal waveform, as shown by dashed line 66. Due to variations in delays in the actual circuit implementation, the actual middle of the preamble phase may not be at dashed line 66, but may be shifted to the left or to the right, for example. When DQS qualification circuit 32 is being calibrated, DQS qualification circuit 32 samples the DQS signal waveform at various delays relative to clock edge 54 and, based on these samples, locates the actual center of the preamble phase and the corresponding delay relative to local clock edge 54. This delay value is then programmed into the circuit that generates the mask signal so that the mask signal rises in the middle of the preamble phase.

FIG. 3 is a schematic diagram illustrating a portion of DQS qualification circuit 32 in greater detail. DQS qualification circuit 32 includes DQS input 36, masked DQS output 38, control circuit 100, mask disable latch 102, programmable delay line 104, DQS mask circuit 106, DQS capture latch 108, and memory 110. Control circuit 100 controls the various functions within DQS qualification circuit 32. Control circuit 100 can form a part of read/write control circuit 21 (shown in FIG. 1) or can be separate from control circuit 21. Control circuit 100 can be implemented in hardware, software or a combination of both hardware and software. For example, control circuit 100 can be implemented as a state machine or a programmed computer.

When control circuit 21 (shown in FIG. 1) issues a read command, control circuit 100 generates a logic high value (for example) on mask disable output 120, which is labeled "DISABLE". Control circuit 100 holds DISABLE high for the remainder of the burst length of the read operation. The DISABLE signal is shown by waveform 68 in FIG. 2.

The DISABLE signal is coupled to data input 122 of mask disable latch 102. In one embodiment, mask disable latch 102 is a D-type flip-flop. However, other types of latches can also be used. Mask disable latch 102 has a clock input 124 coupled to clock signal CLKA. In one embodiment, clock signal CLKA has the same frequency as local clock signal CLK and has a fixed phase relationship with respect to CLK. Mask disable latch 102 has a data output 126, labeled INI_MASK, which is coupled to input 128 of programmable delay line 104. INI_MASK is shown by waveform 70 in FIG. 2 and goes high on the next rising edge of CLKA following the rising edge of DISABLE.

Programmable delay line 104 has a delay control input 130, which is controlled by output 132 of control circuit 100. Programmable delay line 104 has a plurality of propagation delay settings that are programmable through delay control input 130. In one embodiment, programmable delay line 104 has a delay range from a minimum value 134 (shown in FIG. 2) to a maximum value which could be after the post-amble phase of the DQS signal. Minimum delay 134 is measured from the rising edge of CLKA (corresponding to edge 54 of CLK) to the beginning of the preamble phase, at time T2.

Programmable delay-line 104 has a delayed mask output 140 which is coupled to DQS mask circuit 106. DQS mask circuit 106 includes logic AND gates 142 and 144. AND gate 142 has a first input coupled to delayed mask output 140 and a second input coupled to clear input 146. The output of AND gate 142 produces the MASK signal shown by waveform 62 in FIG. 2. Clear input 146 receives a CLEAR_MASK signal, which is used to clear, or "enable", the MASK signal during the post-amble phase of the DQS waveform. The CLEAR_MASK signal can be generated by any suitable logic circuitry. In one embodiment, the CLEAR_MASK signal goes high at the beginning of the preamble phase of DQS and is kept high until an appropriate time in the post amble phase when it goes low. The CLEAR_MASK signal is shown by waveform 72 in FIG. 2.

The MASK signal at the output of AND gate 142 is coupled to a first input of AND gate 144. The second input of AND gate 144 is coupled to DQS input 36. The output of AND gate 144 is coupled to masked DQS output 38. Thus when MASK is in an enabled, low state, the masked DQS signal on output 38 is forced low. When MASK is in a disabled, high state, the masked DQS signal follows the DQS signal received on DQS input 36. The propagation delay through programmable delay line 104 is preferably set such that MASK rises in the middle of the preamble phase of DQS.

DQS capture latch 108 and memory 110 are used by control circuit 100 to measure the appropriate delay through programmable delay line 104 in order for MASK to rise in the middle (or any other desired predetermined temporal location) of the preamble phase. Control circuit 100 locates the center of the preamble phase by capturing values of DQS at different time delays relative to CLKA, storing the sample values in memory 100, locating the preamble phase within the samples and then identifying the delay corresponding to the sample at middle of the preamble phase.

The sampling is done by DQS capture latch 108. DQS capture latch 108 has a data input 160 coupled to DQS input 36, a clock input 162 coupled to MASK, and a data output 164 coupled to input 166 of memory 110. In one embodiment, capture latch 108 is a D-type flip-flop. However, other types of latches can also be used.

Memory 110 stores each of the captured DQS sample values for review by control circuit 100. Memory 110 can include any type of memory device, such as an array of flipflops or a random access memory (RAM). In one embodiment, memory 110 stores each sample in an element of an array, wherein the index to each element of the array corresponds to the propagation delay setting at which the sample was taken. This allows control circuit 100 to review the samples easily and identify the propagation delay associated with each sample.

FIG. 4 is a flow chart illustrating an algorithm for calibrating programmable delay line 104 according to one embodiment of the present invention. At step 200, control circuit 100 progressively sweeps the delay through programmable delay line 104 over a range of different delay settings from a minimum delay value to a maximum delay value through a plurality of program iterations. However the delays can be varied in any other order in alternative embodiments of the present invention.

In step 201, for each delay setting in step 200, memory controller 10 performs a read from memory device 12. For each read operation, capture latch 108 captures the value of DQS at the time MASK goes high (i.e., is disabled). The captured DQS sample values are stored in successive locations within memory array 110, with the index to the array corresponding to the value programmed into the programmable delay line at the time each sample was taken. Once control circuit 100 has completed the sweep of delay settings, at step 202, memory array 110 contains a sampled version of the DQS waveform. At step 203, control circuit 100 finds the middle of the preamble phase by searching through the DQS sample values within the array. The index to the array at that location corresponds to the desired delay value that should be programmed into delay line 104.

At step 204, steps 200–203 are repeated several times to obtain a plurality of index values, which are averaged with one another to remove statistical spread within the DQS waveform from one read to the next. Finally, at step 205, control circuit 100 sets in the delay in programmable delay line 104 to the mean index value for the values located in step 204. From then on, DQS qualification circuit 32 disables MASK at a temporal location that is approximately the center of the preamble phase of DQS. This calibration method can be performed at the initial start-up of the circuit and at any other desirable time.

The method shown in FIG. 4 allows DQS qualification circuit 32 to calibrate-out differences in delays of actual integrated circuit devices and assembled printed circuit boards (PCBs) as compared to estimated delays used during the design process. As a result, the actual circuit is capable of running at a faster clock frequency.

The method shown in FIG. 4 can be modified numerous ways in various alternative embodiments of the present invention. In one alternative embodiment, only a single set of DQS sample values is obtained at step 204. Also, statistical averages can be taken at various other steps within the method shown in FIG. 4. In addition, the sampled DQS values can be obtained during a single read operation according to a further alternative embodiment of the present invention. In this embodiment an array of capture latches 108 are used, with each capture latch sampling DQS at a different delay. Programmable delay line 104 could be programmed with a nominal delay value and each capture latch could be clocked with a progressively greater delayed version of the MASK signal. The outputs of the capture latches can then be reviewed by control circuit 100. Other types of capture circuits can also be used.

FIG. 5 is a diagram illustrating a specific algorithm 300 for locating the middle of the preamble phase in step 203 of FIG. 4. Once again, any alternative algorithm could also be used. In algorithm 300, the memory array is labeled "array" and is indexed by the variable "index". Algorithm 300 assumes that programmable delay line 104 has a resolution of eight samples for each cycle of CLK. When the delay through programmable delay line 104 is increased eight steps, the increased delay value is a whole period of CLK. For purposes of explanation, assume that the memory array contains the following samples after step 202 in FIG. 4:

ARRAY=[0,1,0,1,0,0,0,0,0,0,0,1,0,1,1,1 0,0,0,1,1,1,1,0,0,0,0,0,1,1 . . . ]

Algorithm 300 locates the beginning of the preamble phase of the DQS signal by searching for the following expected pattern within the array:

EXPECTED_DQS=[0,0,1,0,1,0]

These values represent the expected values of DQS at each half cycle of CLK. Since there are eight samples for each cycle of CLK, there is one expected DQS value for every four samples in the array. In the expected DQS values, the two adjacent zero values correspond to the preamble phase, which are then followed by a high phase, a low phase, a high phase and finally a low, post-amble phase of DQS.

FIG. 6 is a diagram illustrating the CLK and DQS waveforms superimposed onto the array of sampled DQS values. Waveform 400 represents the clock signal CLK, and waveform 402 represents the DQS signal. Row 404 represents the contents of the memory array, with each entry representing the sampled DQS value at a particular delay setting of programmable delay line 104. Row 406 represents the corresponding index value used by algorithm 300 to identify each entry in the array.

Row 408 represents a first match of the expected DQS values with the sampled DQS values beginning at index 5 of the array. Row 410 represents a second match of the expected DQS values with the sampled DQS values beginning at index 6 of the array. Index 5 represents a low index value of the window of values for "index" where the expected DQS values match the sampled values. Index 6 represents a high index value of the window of values for "index" where the expected DQS values match the sampled values.

Referring back to FIG. 5, algorithm 300 first finds the low index value of the window. At step 301, algorithm 300 sets the variable PREVIOUS_MATCH to false. At step 302, algorithm 300 sets a step variable to the value "4", indicating that four steps in the delay line correspond to half a CLK period. At steps 303 and 304, algorithm 300 sets a LOW_INDEX variable and a HIGH_INDEX variable to a default value, "−1".

At step 305, algorithm 300 begins a loop in which the value of index is incremented from zero to the maximum index value 320 in the array. For each value of index, step 306 compares the corresponding sampled DQS values to the expected DQS values. For each comparison, algorithm 300 determines, at step 307, if a LOW_INDEX of the window has already been found by checking whether LOW_INDEX is still less than zero. If a LOW_INDEX has not yet been found, algorithm 300 checks if PREVIOUS_MATCH has been set to true, at step 308. If there was a previous match in the last iteration, LOW_INDEX is set to "index—1", which was the index of the previous comparison that was also a match, at step 309. If there was no previous match, PREVIOUS_MATCH is set to "true" at step 310, and the process repeats with another loop iteration.

Once there has been a match at steps 306 and LOW_INDEX has already been found (LOW_INDEX>=0), algorithm 300 skips from step 307 to step 311. At step 312, the HIGH_INDEX is set to the present value of "index", which is the last value of index where the pattern matched. HIGH_INDEX keeps incrementing with each pass through step 305 until there are no more matches between the sampled DQS values and the expected DQS values. At step 313, if there is no match at step. 306, then PREVIOUS_MATCH is set to "false".

With the example shown in FIG. 6, algorithm 300 results in LOW_INDEX=5 and HIGH_INDEX=6. The LOW_INDEX and the HIGH_INDEX are then averaged by control circuit 100 to locate a stable beginning of the preamble phase and to avoid the uncertainty regions of DQS. The middle of the preamble phase is then calculated as ¼ clock cycle after the approximated beginning of the preamble phase. In the above example, the middle of the preamble phase is determined by: Middle=(LOW_INDEX+HIGH_INDEX)/2+step/2, rounded to an integer. With step=4, the middle is located at approximately 7.5, which can be rounded to an integer 8.

Thus the delay setting used to produce the DQS sample value at index 8 in FIG. 6 corresponds to the delay setting that is programmed into delay line 104 in order to cause MASK to transition high in the middle of the preamble phase. Once this delay setting has been determined by control circuit 100, the control circuit loads this delay setting into delay line 104. Numerous other methods and algorithms can be used to locate the approximate middle of the preamble phase based on a set of sampled DQS values. The methods shown in FIGS. 4–6 are provided as examples only.

The middle of the preamble phase can be located at the initial power-up of the circuit in which the memory controller is used and can be performed at any appropriate subsequent time to accommodate for changes in delays, voltage and temperature.

Although the present invention has been described with reference to preferred embodiments, workers skilled in the art will recognize that changes may be made in form and detail without departing from the spirit and scope of the invention. For example, DQS qualification circuit can be used with any memory device (or register) where the read data is aligned with respect to a clock strobe that originates from the memory device and the clock strobe has phase constraints with respect to a clock supplied to the memory device. The qualification circuit can be used as part of an overall memory controller or as discrete logic associated with a device, such as register, that latches data read from such a memory device. In addition, the term "coupled" used in the specification and the claims can include a direct connection and a connection through one or more intermediate components.

What is claimed is:

1. A method of calibrating a mask signal for masking a data strobe signal received from a memory device with read data, the method comprising:
   a) performing at least one read operation from the memory device;
   b) sampling the data strobe signal received in response to step a) at a plurality of different time delays relative to a local clock signal to produce a plurality of data strobe sample values;
   c) searching the plurality of data strobe sample values to identify a temporal location within a preamble phase of the data strobe sample values and one of the time delays that corresponds to the temporal location; and
   d) setting a delay at which the mask signal is disabled in response to a read operation relative to the local clock signal based on the time delay identified in step c).

2. The method of claim 1 wherein step b) comprises:
   b) i) generating an initial mask signal which transitions to a disabled state relative to the local clock signal in response to the read operation of step a);
   b) ii) passing the initial mask signal through a programmable delay line, which has a plurality of selectable propagation delays, to produce a delayed mask signal;
   b) iii) successively programming the programmable delay line to successively different ones of the selectable propagation delays through a plurality of program iterations; and
   b) iv) for each program iteration in step b) iii), performing a read operation in step a) and sampling the data strobe signal as the delayed mask signal transitions to the disabled state.

3. The method of claim 2 wherein step b) further comprises:
   b) v) storing the data strobe sample values produced in step b) iv) in a memory.

4. The method of claim 3 wherein:
   step b) iii) comprises progressively sweeping the propagation delay between a minimum one of the selectable propagation delay and a maximum one of the selectable propagation delays; and step b) v) comprises storing the data strobe sample values in a memory array, wherein the memory array has an index for each data strobe sample value that corresponds to the propagation delay at which that sample was taken.

5. The method of claim 1 wherein step c) comprises comparing a pattern formed by the data strobe sample values to an expected pattern.

6. The method of claim 1 wherein step b) comprises storing the data strobe sample values in a memory array, wherein the memory array has an index for each data strobe sample value that corresponds to the time delay at which that sample was taken.

7. The method of claim 6 wherein step c) comprises locating an expected pattern within the memory array and identifying one of the indexes as corresponding to the temporal location relative to the expected pattern.

8. The method of claim 7 wherein step c) further comprises identifying the time delay that corresponds to the index identified as corresponding to the temporal location.

9. A read data strobe qualification circuit comprising:
   a data strobe input;
   a mask disable control input;
   a programmable delay line coupled to the mask disable control input and having a delayed mask control output;
   a data strobe mask circuit having inputs coupled to the data strobe input and the delayed mask control output and having a masked data strobe output which represents the data strobe input masked by the delayed mask control output;
   a data strobe capture circuit having a data input coupled to the data strobe input, a capture control input coupled to the delayed mask control output, and a captured data strobe output;
   a first memory device coupled to the captured data strobe output; and
   a control circuit coupled in a feedback loop from the memory device to a delay control input of the programmable delay line.

10. The read data strobe qualification circuit of claim 9 wherein the control circuit comprises:
    means for programming the programmable delay line to successively different propagation delay settings through a plurality of program iterations;
    means for issuing a read command to a second memory device for each program iteration;
    means for generating a mask disable control signal on the mask disable control input which transitions to a disabled state relative to a local clock signal in response to the read command, wherein the data strobe capture circuit samples the data strobe input at each transition of the delayed data strobe output to the disabled state to produce a data strobe sample value on the captured data strobe output; and
    means for storing the data strobe sample value produced with each program iteration in the first memory device.

11. The read data strobe qualification circuit of claim 10 wherein the control circuit further comprises:
    means for identifying a temporal location within a preamble phase of the data strobe sample values stored in the first memory device and identifying a desired one of the propagation delay settings that corresponds to the temporal location; and
    means for programming the programmable delay line with the desired propagation delay setting.

12. The read data strobe qualification circuit of claim 11 wherein the means for identifying locates an expected pattern within the data strobe sample values and identifies the desired propagation delay setting that corresponds to the temporal location relative to the expected pattern.

13. The read data strobe qualification circuit of claim 10 wherein:

the means for programming progressively sweeps the propagation delay settings between a minimum one of the propagation delay settings and a maximum one of the propagation delay settings; and the means for storing stores the data strobe sample values in a memory array, wherein the memory array has an index for each data strobe sample value that corresponds to the propagation delay setting at which that sample was taken.

14. The read data strobe qualification circuit of claim 9 and further comprising:

a local clock input; and a latch having a latch data input coupled to the mask disable control input, a latch clock input coupled to the local clock input and a latch data output coupled to the programmable delay line.

15. The read data strobe qualification circuit of claim 9 and further comprising:

a clear mask input; and a logic AND gate having a first input coupled to the clear mask input, a second input coupled to the delayed mask control output, and an output coupled to the capture control input of the data strobe capture circuit and to an input of the data strobe mask circuit.

16. The read data strobe qualification circuit of claim 9 wherein the data strobe capture circuit comprises a D-type flip-flop.

* * * * *